United States Patent [19]

Lee

[11] Patent Number: 5,986,918

[45] Date of Patent: Nov. 16, 1999

[54] SYNCHRONOUS READ ONLY MEMORY DEVICE

[75] Inventor: June Lee, Seoul, Rep. of Korea

[73] Assignee: Samsung Electronics Co., Ltd., Kyungki-do, Rep. of Korea

[21] Appl. No.: 09/124,340

[22] Filed: Jul. 29, 1998

[30] Foreign Application Priority Data

Jul. 29, 1997 [KR] Rep. of Korea ............ 97-35818

[51] Int. Cl.$^6$ ................................................. G11C 17/00
[52] U.S. Cl. ................ 365/103; 365/233; 365/238.5; 365/239
[58] Field of Search ............................. 365/103, 104, 365/233, 238.5, 239

[56] References Cited

U.S. PATENT DOCUMENTS 5,572,481 11/1996 Wilson ............................ 365/103 X
5,581,512 12/1996 Kitamura ........................... 365/233

Primary Examiner—Huan Hoang
Attorney, Agent, or Firm—F. Chau & Associates, LLP

[57] ABSTRACT

A read only memory device having a given burst length comprises: a memory cell array having a plurality of memory cells, each of the memory cell storing a data bit; a pass gate circuit having a plurality of pass gate blocks assigned to a plurality of bit lines coupled to the memory cells; a sense amplifier circuit having a plurality of sense amplifiers connected to the pass gate blocks with a given ratio thereof; decoding means for causing the pass gate circuit to transfer a given number of the data bits from the memory cells to the sense amplifier circuit; and means for receiving the data bits from the sense amplifier circuit and for outputting a plurality of data bits corresponding to the burst length in a given operation mode. The memory device preferably conducts in a sequential mode or interleave mode, with a pipelined data output configuration according to the burst length.

6 Claims, 12 Drawing Sheets

SYNCHRONOUS READ ONLY MEMORY DEVICE

FILED OF THE INVENTION

The invention is in the field of read only memories (ROMs), and more specifically related to mask ROMs receiving a synchronous clock and employing a burst read-out mode.

BACKGROUND OF THE INVENTION

A mask ROM, in which data is written in a memory cell by means of an ion implantation with mask pattens, has reasonable properties applicable to a larger capacity and a lower cost-per-bit so that it is advantageous in manufacturing mass products by using the mask patterns for data writing (or programming) and also in enhancing the efficiency of occupation with memory cells each of which is composed of one transistor per bit. Current applications for the mask ROM are typically addressed in storing data for fonts, characters and fixed programs (e.g., BIOS program) in personal computers, word processors, electronic entertainment apparatuses, printers, electronic organizers, personal digital assistants (PDA).

As there is an usual limit upon the operating speed for accessing data in a mask ROM, being effected mostly by resistance and capacitance strayed along word lines and bit lines therein, it is necessary to reduce a delay rate on a word line and to accelerate the time for sensing data. Although several efforts have been proposed to reduce the delay factors, such as using policide as a material for a word line, and increasing the number of divided blocks in a cell array and so on, the operating frequency in a mask ROM has still been positioned, with a remarkable gap, under those in general processors (e.g., MPU or CPU).

SUMMARY OF THE INVENTION

Accordingly, it is an object of the invention to provide a mask ROM capable of enhancing an operation speed therein.

It is another object of the invention to provide a mask ROM having high speed in accessing data, being synchronized with an external clock therein.

In order to accomplish the above and other objects, one embodiment of the invention includes a read only memory device of a given burst length which includes: a pass gate circuit having a plurality of pass gate blocks assigned to a plurality of bit lines coupled to memory cells; a sense amplifier circuit having a plurality of sense amplifiers connected to the pass gate blocks with a given ratio thereof; and a decoding circuit, such as a Y-decoder, for making the pass gate circuit transfer a given number of the data bits from the memory cells to the sense amplifier circuit. Output data bits are pipelined in a stream with a corresponding burst length in an operation mode (sequential or interleave).

Another embodiment of the invention includes a memory device which includes: a mode register for setting an operation mode which determines an order of outputting the data bits according to the burst length; a pass gate circuit having a plurality of pass gate blocks assigned to a plurality of bit lines coupled to the memory cells; a sense amplifier circuit having a plurality of sense amplifiers connected to the pass gate blocks with a given ratio thereof; decoding means, such as a Y-decoder, for making the pass gate circuit transfer a given number of the data bits from the memory cells to the sense amplifier circuit. Output data bits are streamed in a burst chain with a given length in a sequential or an interleave mode.

The invention also preferably includes the sense amplifier being conducted, a given number of times, to sense the data bits, and the decoding means receiving a flag signal informing of the number of sensing operations by the sense amplifier circuit and a mode setting signal informing of the operation mode, from the mode register.

BRIEF DESCRIPTION OF THE DRAWINGS

For a better understanding of the invention, and to show how embodiments of the same may be carried into effect, reference will now be made, by way of example, to the accompanying diagrammatic drawings, in which.

In the figures, like reference numerals denote like or corresponding parts.

DETAILED DESCRIPTION OF PREFERRED EMBODIMENTS

Applicable embodiments of the invention will be as follows, with the appended drawings, and the mask ROM described hereinbelow according to invention is referred to as synchronous mask ROM (SMROM).

A First Embodiment

Figure 1:
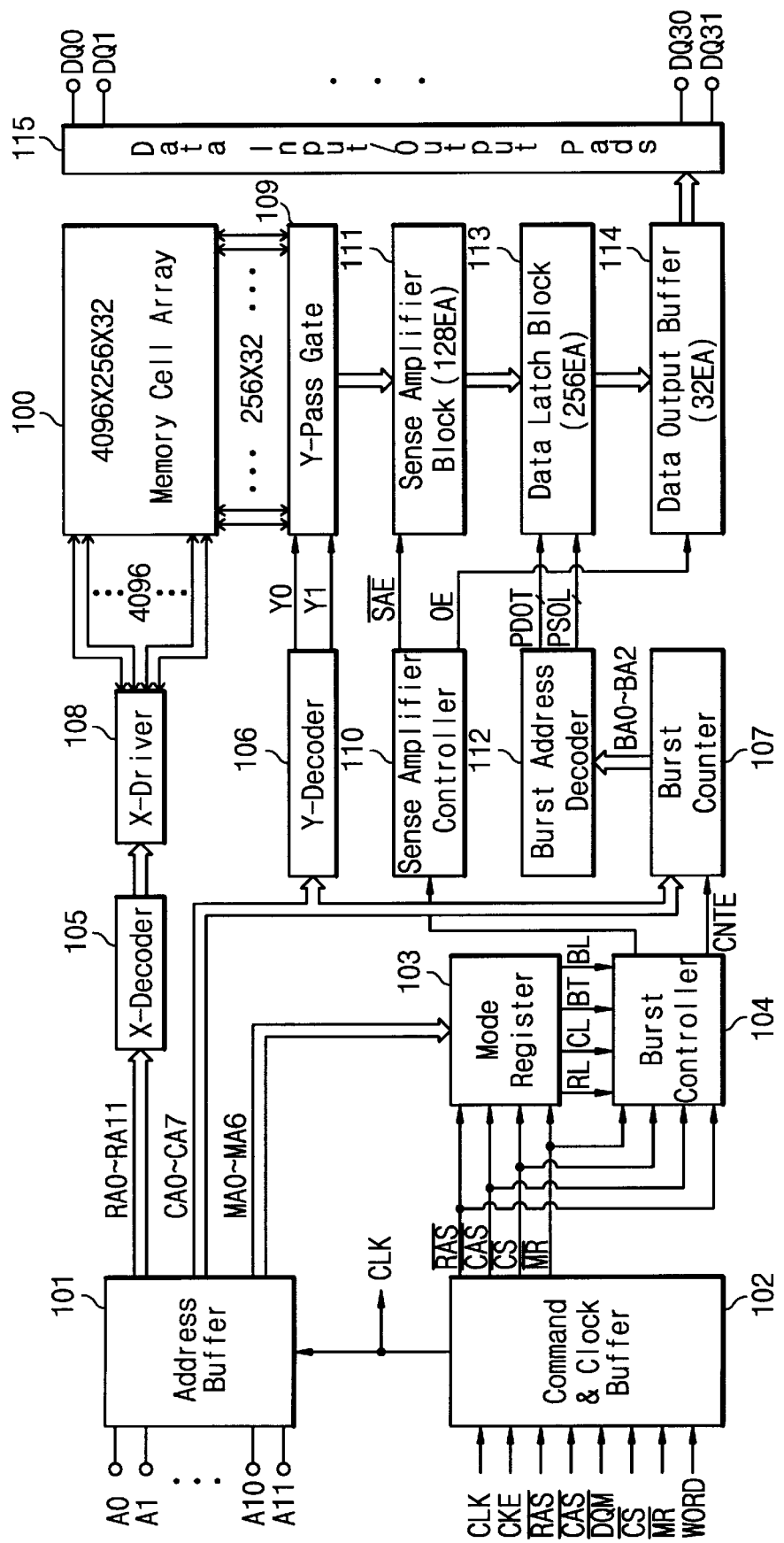
FIG. 1 is a block diagram of a synchronous mask ROM according to a first embodiment of the invention.

FIG. 1 shows an overall construction of SMROM having cell array of 32 Mb (i.e., 32 megabits; 4096 rows×256 columns×32 data bits), employing twelve address pins A0~A11 and thirty data input/output pins. Referring to FIG.

1, address buffer 101 generates twelve row address signals RA0~RA11, eight column address signals CA0~CA7 and seven mode address signals MA0~MA6, from the external address signals A0~A11. Command/clock buffer 102 receives clock signal XCLK (a prefix "X" means it is an external clock or signal, hereinafter), clock enable signal XCKE, row address strobe signal XRASB (hereinafter, suffix "B" in any signal name means a negative logic), column address strobe signal XCASB, data input/output masking signal XDQMB, chip selection signal XCSB, mode register writing signal XMRB and word/double-word signal XWORD, from external circuitry (not shown).

Clock enable signal CKE is used for masking clock CLK ("masking" means that CLK is rendered to be activated in a specified timing period controlled by CKE), and makes the buffers, 101 and 102, be disabled during a stand-by mode so as to reduce power consumption. Mode address signals MA0~MA6 are applied to mode register 103 when all of chip selection signal CSB, row address strobe signal RASB, column address signal CASB and mode register writing signal MRB are activated in a clock cycle (an operation occurring in one time period of the clock CLK). By setting mode register 103, it may be possible to program the values of RAS latency, CAS latency, a type of burst and a burst length, and vendor-specific options thereof. "Latency" means the number of cycles of the clock CLK consumed until a first data bit appears at data input/output pads 115 after the address strobe signal (RASB or CASB) has been enabled, and the burst length denotes the number of pages subsequently generated, with a predetermined RAS (or CAS) latency, in accordance with one read-out command (or during one read-out cycle). The page is a unit of data bundle withdrawn from the cell array in one times of a read-out cycle, by which the number of data bits will be set into 32, in the invention. In preferred embodiments of the invention, the burst length is practiced to be defined as 32, that is also the number of data bits belonging to one page. Data input/output masking signal DQMB causes data output operation to be inhibited after a predetermined time from a rising edge of CLK, rendering a data line to be in a high impedance state. Chip selection signal CSB controls all of inputs, but CLK, CKE and DQMB, and internal circuits.

Burst controller 104 receives chip selection signal CSB, row address strobe signal RASB, column address strobe signal CASB, mode register writing signal MRB, from command/clock buffer 102, RAS latency signal RL, CAS latency signal CL, burst type signal BT and burst length signal BL, from mode register 103, and generates control signals (e.g., PSAE, PDIS, PPRE, PPZM and POE, not shown just in FIG. 1) involved in sensing data, control signals for creating burst address signals (e.g., BA0, BA1 and BA2), and signals (e.g., counter enable signal CNTE) for controlling burst counter 107. Row and column address signals generated from address buffer 101 are applied to X-decoder 105 and Y-decoder 106, respectively. X-decoder 105 generates row selection signals in response to the row address signals, and Y-decoder 106 generates gating control signals Y0~Y63 for making Y-pass gate select columns corresponding to memory cells in cell array 102, in response to the column address signals. Lower three bits, CA0 through CA2, are exclusively applied to burst counter 107 as initial burst address signals. X-driver 108 causes a selected word line to be conductive in response to the row selection signals generated from X-decoder 105. Y-pass gate 109 selectively transfers data bits corresponding to the defined burst length to sense amplifier 111 from cell array 100, in response to the gating control signals Y0~Y63. Sense amplifier controller 110 generates precharge control signal PRE, equalizing control signal PZM, sense amplifier enable signal SAEB and discharge signal DIS, for controlling an operation of sense amplifier 111, and output enable signal OEB for controlling a data output operation, in response to the output signals generated from burst controller 104. Burst address decoder 112 receives burst address signals BA0 through BA2 from burst counter 107, and then generates latch selection signals PDOT0, PDOT1 and PSOL0 through PSOL7.

Assuming that the burst length is 8, 256 bits (8 pages×32 data bits) are generated therein throughout eight times of read-out cycles by 32 bits. In order to deal with the data bits of 256, the invention does not contemplate two hundred fifty six sense amplifiers which may cause a larger chip size and a greater power consumption. Instead, the sense amplifier block 111, according to the invention, has 128 units of sense amplifiers, as an example, by which the whole data bits corresponding to the 8 burst length are accessed in two times of read-out cycles. Alternatively, by way of further example, 64 units in the block 111 may be employed to sense the 256 data bits in four cycle times. Data latch block 113 has 256 latches storing all of the data bits corresponding to 8 pages applied each from the units of sense amplifier block 111 and providing them to data output buffer 114 by a unit of page (or by 32 bits) in response to the latch selection signals supplied from burst address decoder 112.

Figure 2:
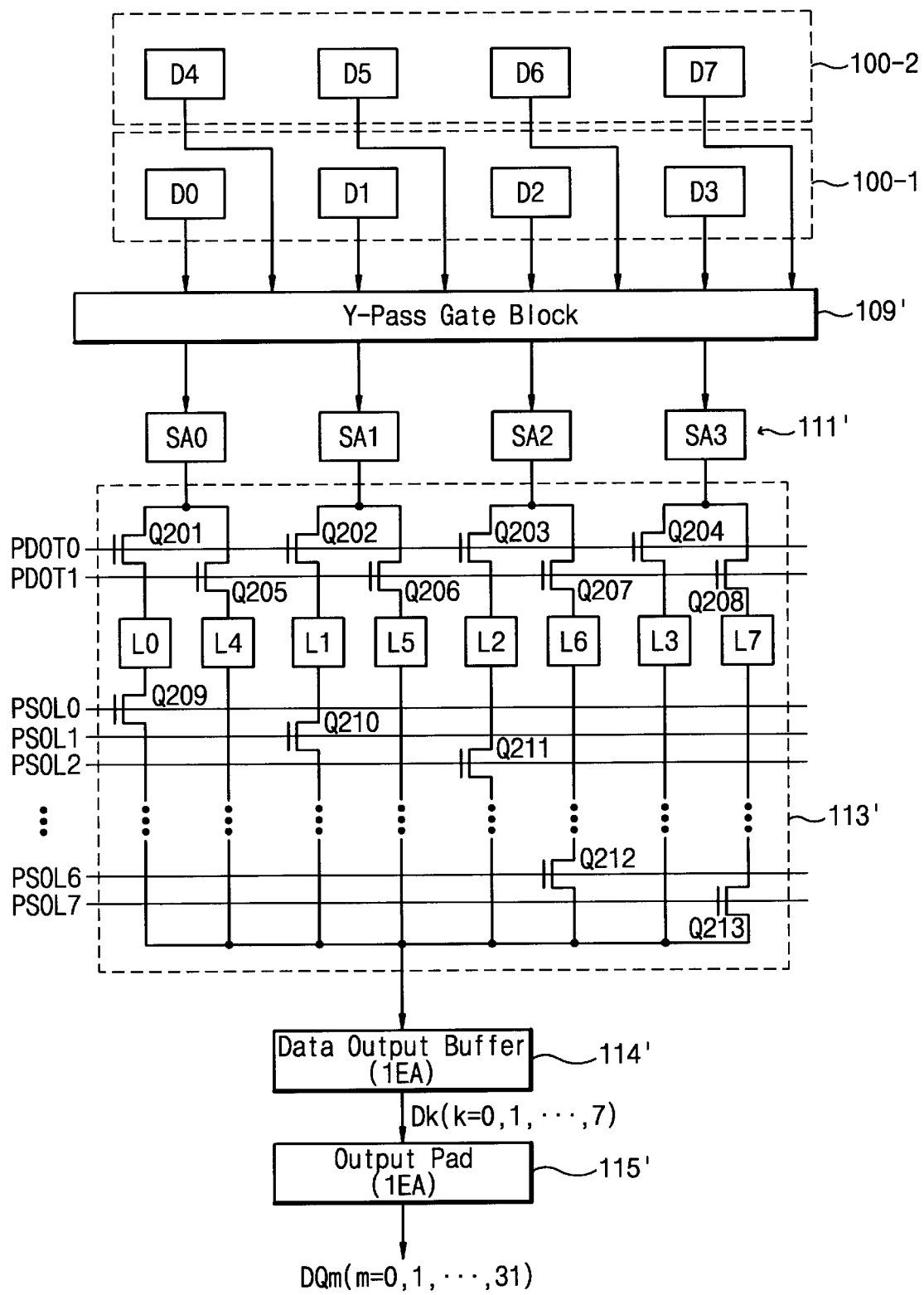
FIG. 2 is a schematic diagram of circuits involved in accessing data from a cell array to an output pad during a burst read-out mode in FIG. 1.

FIG. 2 shows a correlated configuration with circuit elements on a data output path assigned to one of data input/output pads 115 of FIG. 1. It should be understood that, although not shown in FIG. 2, data input/output pad 115' (or data input/output pin DQM; m=0~31) corresponds to a cell block including 256 columns therein. Reference numerals 100-1 and 100-2 represent a couple of data sets retrieved each from the first and second sensing cycles. Thus, eight data bits, corresponding to the predetermined burst length 8, from eight memory cells are applied to block unit 111' having four sense amplifiers SA0~SA3 through Y-pass gate block 109' of the Y-pass gate 109, for two times of the sensing cycles. The sense amplifier block 111 of FIG. 1 has 32 block units like the 111'.

Block unit 113' of the data latch block 113 has eight latches L0~L7, input selection transistors Q201~Q208 for transferring four data bits provided from sense amplifier block unit 111' alternatively to two groups of latches, L0~L3 and L4~L7, in response to input selection signals PDOT0 and PDOT1 generated from burst address decoder 112, and output selection transistors Q209~Q213 for transferring, in response to output selection signals PSOL0~PSOL7 provided from burst address decoder 112, eight data bits held in latches L0~L7 to unit 114' of data output buffer 114, by one bit, in the order of Table 1.

TABLE 1

| initial address | | | sequential mode | | | | | | | | interleave mode | | | | | | | |
|---|---|---|---|---|---|---|---|---|---|---|---|---|---|---|---|---|---|---|
| CA2 | CA1 | CA0 | | | | | | | | | | | | | | | | |
| 0 | 0 | 0 | 0 | 1 | 2 | 3 | 4 | 5 | 6 | 7 | 0 | 1 | 2 | 3 | 4 | 5 | 6 | 7 |
| 0 | 0 | 1 | 1 | 2 | 3 | 4 | 5 | 6 | 7 | 0 | 1 | 0 | 3 | 2 | 5 | 4 | 7 | 6 |
| 0 | 1 | 0 | 2 | 3 | 4 | 5 | 6 | 7 | 0 | 1 | 2 | 3 | 0 | 1 | 6 | 7 | 4 | 5 |
| 0 | 1 | 1 | 3 | 4 | 5 | 6 | 7 | 0 | 1 | 2 | 3 | 2 | 1 | 0 | 7 | 6 | 5 | 4 |
| 1 | 0 | 0 | 4 | 5 | 6 | 7 | 0 | 1 | 2 | 3 | 4 | 5 | 6 | 7 | 0 | 1 | 2 | 3 |
| 1 | 0 | 1 | 5 | 6 | 7 | 0 | 1 | 2 | 3 | 4 | 5 | 4 | 7 | 6 | 1 | 0 | 3 | 2 |
| 1 | 1 | 0 | 6 | 7 | 0 | 1 | 2 | 3 | 4 | 5 | 6 | 7 | 4 | 5 | 2 | 3 | 0 | 1 |
| 1 | 1 | 1 | 7 | 0 | 1 | 2 | 3 | 4 | 5 | 6 | 7 | 6 | 5 | 4 | 3 | 2 | 1 | 0 |

Table 1 shows output orders of data during a burst read-out operation which has two independent counting modes; the sequential and interleave, with burst length 8. In Table 1, eight data bits are denoted is 0, 1, . . . and 7, and the initial burst address for selecting a cell from which a first data bit is read out is assigned to three column address signals CA2, CA1 and CA0.

Once the three bits of the column address bits for burst addresses are set into burst counter 107, the burst counter 107 creates eight burst addresses in accordance with the types of an initial address and a burst formation. In the instance as shown in the Table 1, as assuming before, eight burst addresses adaptable to the burst length of 8 are created from "00" to "11", the "000" being an initial burst address. Those eight burst addresses can select eight memory cells in which eight data bits corresponding to the burst length of 8. Assuming that eight data bits D1 through D7, shown in FIG. 2 are each stored in eight memory cells of the burst length 8 (eight) and the initial burst address of CA2 through CA0 is "11", the output order of the data bits is D3→D4→D5→D6→D7→D0→D1→D2 in the sequential mode, and otherwise D3→D2→D1→D0→D7→D6→D5→D4 in the interleave mode. As shown in the Table 1, in the interleave mode, the data bits within the burst length can be divided into two sets of lower data bits and upper data bits when those are put into the output order thereof, according to the state of the most significant address bit CA2. That is, CA2 of "0" makes the lower data bits 0 through 3 be accessed ahead of the upper data bits 4 through 7, and CA2 of "1" does the reverse.

Figure 3:
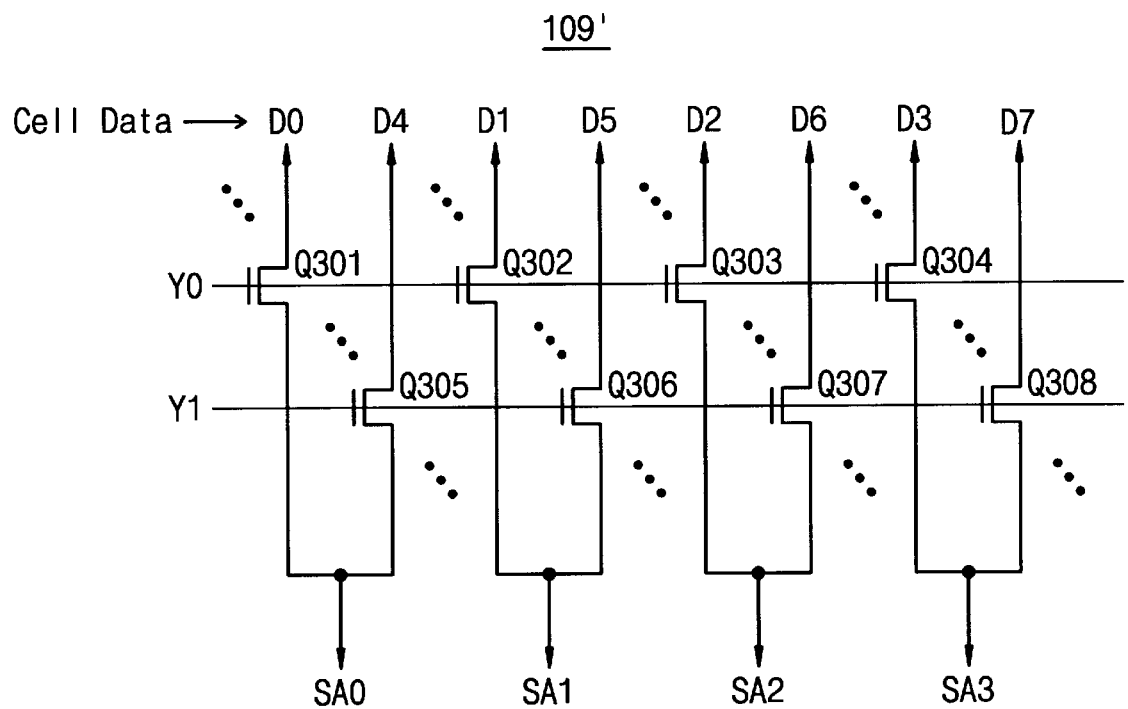
FIG. 3 is a circuit diagram of an Y-pass gate block shown in FIG. 2.

FIG. 3 shows a detail circuit of the Y-pass gate block 109' of FIG. 2, being assigned to the eight data bits of the burst length. Pass transistors Q301~Q308 are connected between the data lines for D0~D7 and sense amplifiers SA0~SA3 to which an adjacent pair of the pass transistors is connected in common, and are divided into two groups for corresponding to the two times of the sensing cycles. Gates of pass transistors Q301~Q304 of one group are coupled to gating control signal Y0, and gates of pass transistors Q305~Q308 to gating control signal Y1. The gating control signals Y0 and Y1 are created from column address signal CA2, that is the most significant bit of the initial burst address, the operation timings of which, when the initial burst address is "000", are illustrated in FIG. 4.

Figure 4:
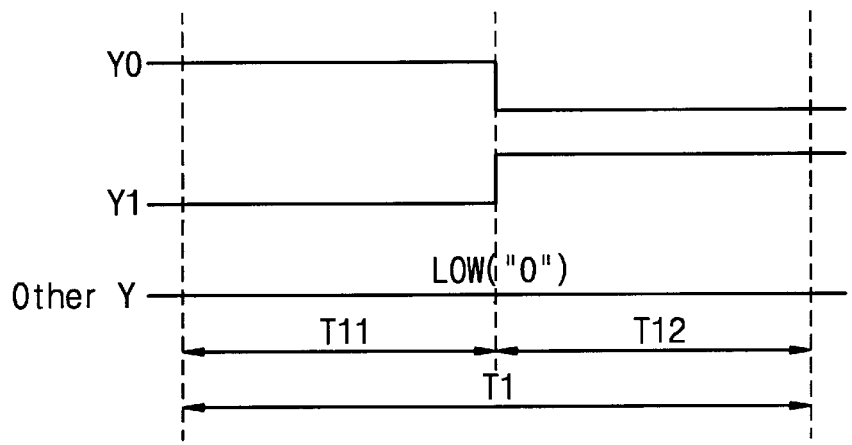
FIG. 4 is a timing diagram illustrating features of signals for controlling the Y-pass gate block in FIG. 3.

Referring to FIG. 4, during the first sensing period T11 in entire sensing (or gating) period T1, gating control signal Y0 is enabled with high level to transfer the one sets of the data bits, D0~D3, to the sense amplifiers SA0~SA3, while, during the second sensing period T12 of the entire sensing period T1, the other sets of the data bits, D4~D7, is applied to the sense amplifiers SA0~SA3 by gating control signal Y1 at a high level. During the sensing period T1, other gating control signals are held in inactivation states of low levels.

Figure 5:
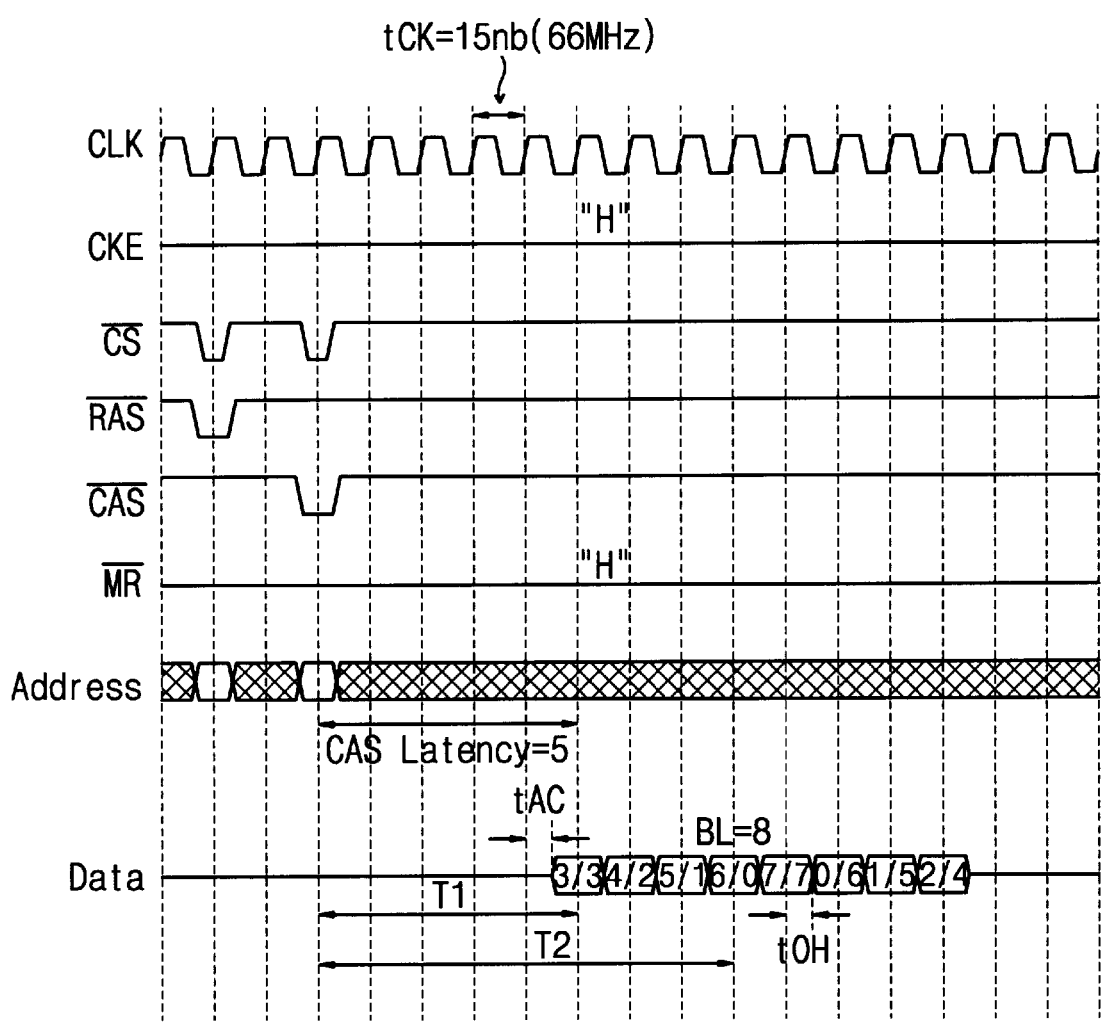
FIG. 5 is a timing diagram illustrating a read-out operation during the burst read-out mode in the memory of FIG. 1.

Now, referring to FIG. 5, an explanation of the burst read-out operation will be given, which assumes that the cycle time of clock CLK, tCLK, is 15 ns (nanoseconds), CAS latency is 5, the burst length is also 8 and the initial burst address is "011". The cycle time of 15 ns means that the operating frequency (or speed) of the memory is 66 MHz. Those embodied conditions mean that output data is sequentially generated through eight times, after five clock cycles from an activation of the column address strobe signal CASB. And the burst length of 8 needs three bits of burst address such as BA0, BA1 and BA2. In FIG. 5, clock enable signal CKE is held at high level while CLK is being oscillated. As row address strobe signal RASB, together with chip selection signal CSB, is enabled to drop to low level responding to the second rising of CLK, row address signals RA0~RA11 are latched in address buffer 101. And, in sequence, column address signals CA0~CA7 are latched in address buffer 101 when column address strobe signal CASB, together with CSB, goes down to low level at the fourth rising of CLK. After five cycle times of CLK from the activation of CASB, output data bits of one page appear at the data lines. Since the initial burst address is assumed to be "11", the order of data bits generated is, as shown in Table 1, 3-4-5-6-7-0-1-2 (i.e., D3-D4-D5-D6-D7-D0-D1-D2) in the sequential mode or 3-2-1-0-7-6-5-4 (i.e.,D3-D2-D1-D0-D7-D6-D5-D4) in the interleave mode.

An available sensing time for the burst read-out can be T1 (the sensing period for the eight data bits in BL=8) in the sequential mode or T2 in the interleave mode. T1 and T2 are about 75 ns and 120 ns, as estimated in FIG. 5, for the clock cycle time of 15 ns, respectively. As known from FIGS. 3 and 4, in the interleave mode, the first four data bits on the burst chain, D3-D2-D1-D0, are all included in the first period T11, and the later four data bits on the burst chain, D7-D6-D5-D4, are all accessed in the second period T12. On the other side, in the sequential mode, the first data bit and the second data bit on the burst chain, D3-D4, are included in different sensing cycle times each other, in which the first data bit D3 is accessed in T11 while the second data bit D4 in T12. As shown in FIGS. 3 and 4, D3 passes through Q304 under the control of Y0 while D4 passes through Q305 under the control of Y1. Thus, the available sensing time in the sequential mode is permitted to be limited within T1, by which this embodiment may preferably be useful in a memory employing the value of the CAS latency CL, five or more. Otherwise, in the interleave mode, since the first and later four data bits are each pipelined in serial and thereby there is no need of changing the Y-gate controlling (e.g., from Y0 to Y1), the T2 can be extended thereto until a first data bit D7 of the second sensing time with Y1 appears.

A Second Embodiment

This embodied configuration is presented for providing an extensible margin of the sensing cycle time which is limited in conducting the sequential mode, as described in the former embodiment.

Figure 6:
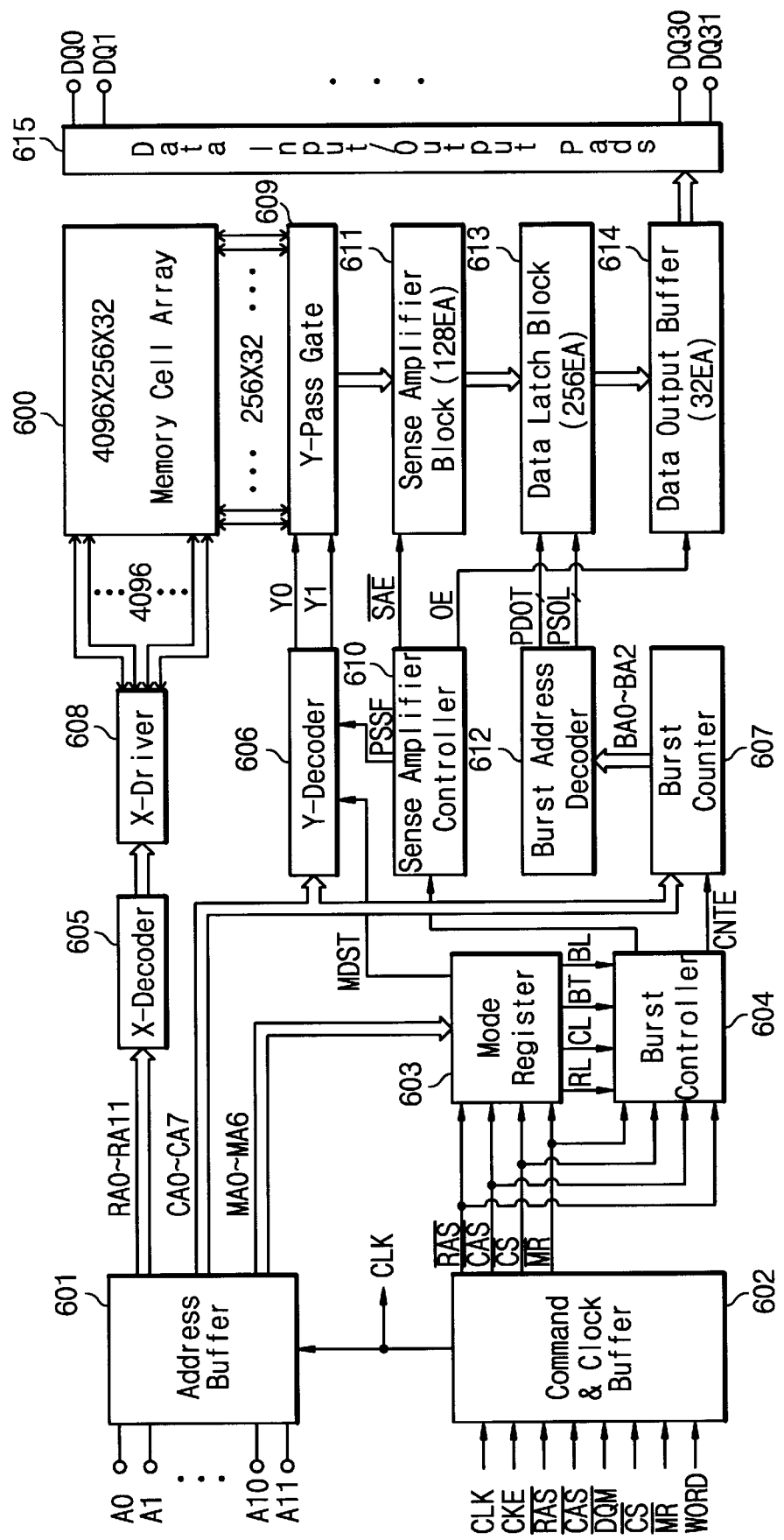
FIG. 6 is a block diagram of a synchronous mask ROM according to a second embodiment of the invention.

FIG. 6 shows an overall construction of SMROM having cell array of 32 Mb (i.e., 32 megabits; 4096 rows×256 columns×32 data bits), employing twelve address pins A0~A11 and thirty data input/output pins, as in FIG. 1. Address buffer 601 (corresponding to 101 of FIG. 1) generates twelve row address signals RA0~RA11, eight column address signals CA0~CA7 and seven mode address signals MA0~MA6, from the external address signals A0~A11. Command/clock buffer 602 (corresponding to 102 of FIG. 1) receives clock signal XCLK, clock enable signal XCKE, row address strobe signal XRASB, column address strobe signal XCASB, data input/output masking signal XDQMB, chip selection signal XCSB, mode register writing signal XMRB and word/double-word signal XWORD, from external circuitry (not shown).

Clock enable signal CKE is used for masking clock CLK, and makes the buffers, 601 and 602, be disabled during a stand-by mode so as to reduce power consumption. Mode address signals MA0~MA6 are applied to mode register 603 (corresponding to 103 of FIG. 1) when all of chip selection signal CSB, row address strobe signal RASB, column address signal CASB and mode register writing signal MRB are activated in a clock cycle. Data input/output masking signal DQMB causes data output operation to be inhibited after a predetermined time from a rising edge of CLK, rendering a data line to be in a high impedance state. Chip selection signal CSB controls all of inputs, but CLK, CKE and DQMB, and internal circuits.

Mode register 603 generates the values of RAS latency RL, CAS latency CL, burst length signal BL, burst type signal BT and mode setting signal MDST. Burst controller 604 (corresponding to 104 of FIG. 1) receives chip selection signal CSB, row address strobe signal RASB, column address strobe signal CASB, mode register writing signal MRB, from command/clock buffer 602, RAS latency signal RL, CAS latency signal CL, burst type signal BT and burst length signal BL, from mode register 603, and generates control signals (e.g., PSAE, PDIS, PPRE, PPZM and POE, not shown just in FIG. 6) involved in sensing data, control signals for creating burst address signals (e.g., BA0, BA1 and BA2), and signals (e.g., counter enable signal CNTE) for controlling burst counter 607 (corresponding to 107 of FIG. 1). Row and column address signals generated from address buffer 601 are applied to X-decoder 605 and Y-decoder 606 (each corresponding to 105 and 106, of FIG. 1, respectively. X-decoder 605 generates row selection signals in response to the row address signals.

Y-decoder 606 generates gating control signals Y0~Y63 for making Y-pass gate select columns corresponding to memory cells in cell array 602, in response to the column address signals. The Y-decoder 606 receives mode setting signal MDST from mode register 603 and flag signal PSSF from sense amplifier controller 610, in order to let the gating control signals properly switch data bits in accordance with a running order of the sensing cycles (this is described in more detail hereinbelow).

Lower three bits, CA0 through CA2, are exclusively applied to burst counter 607 as initial burst address signals. X-driver 608 (corresponding to 108 of FIG. 1) causes a selected word line to be conductive in response to the row selection signals generated from X-decoder 605. Y-pass gate 609 (corresponding to 109 of FIG. 1) selectively transfers data bits corresponding to the defined burst length to sense amplifier block 611 (corresponding to 111 of FIG. 1) from cell array 600 (corresponding to 100 of FIG. 1), in response to the gating control signals Y0~Y63.

Sense amplifier controller 610 generates precharge control signal PRE, equalizing control signal PZM, sense amplifier enable signal SAEB and discharge signal DIS, for controlling an operation of sense amplifier 111, and output enable signal OEB for controlling a data output operation, in response to the output signals generated from burst controller 104. The sense amplifier controller 610 further generates flag signal PSSF which informs the number of times of sensing cycles.

Burst address decoder 612 (corresponding to 112 of FIG. 1) receives burst address signals BA0 through BA2 from burst counter 607, and then generates latch selection signals PDOT0, PDOT1 and PSOL0 through PSOL7.

As in the former embodiment, assuming that the burst length is 8, 256 bits (8 pages×32 data bits) are generated therein throughout eight times of read-out cycles by 32 bits. In order to deal with the data bits of 256, the invention does not contemplate two hundred fifty six sense amplifiers which may cause a larger chip size and a greater power consumption. Instead, the sense amplifier block 611, according to the invention, has 128 units of sense amplifiers, as an example, by which the whole data bits corresponding to the 8 burst length are =accessed in two times of read-out cycles. Alternatively, by way of further example, 64 units in the block 611 may be employed to sense the 256 data bits in four cycle times. Data latch block 613 (corresponding to 113 of FIG. 1) has 256 latches storing all of the data bits corresponding to 8 pages applied each from the units of sense amplifier block 611 and providing them to data output buffer 614 (corresponding to 114 of FIG. 1) by a unit of page (or by 32 bits) in response to the latch selection signals supplied from burst address decoder 612.

Figure 7:
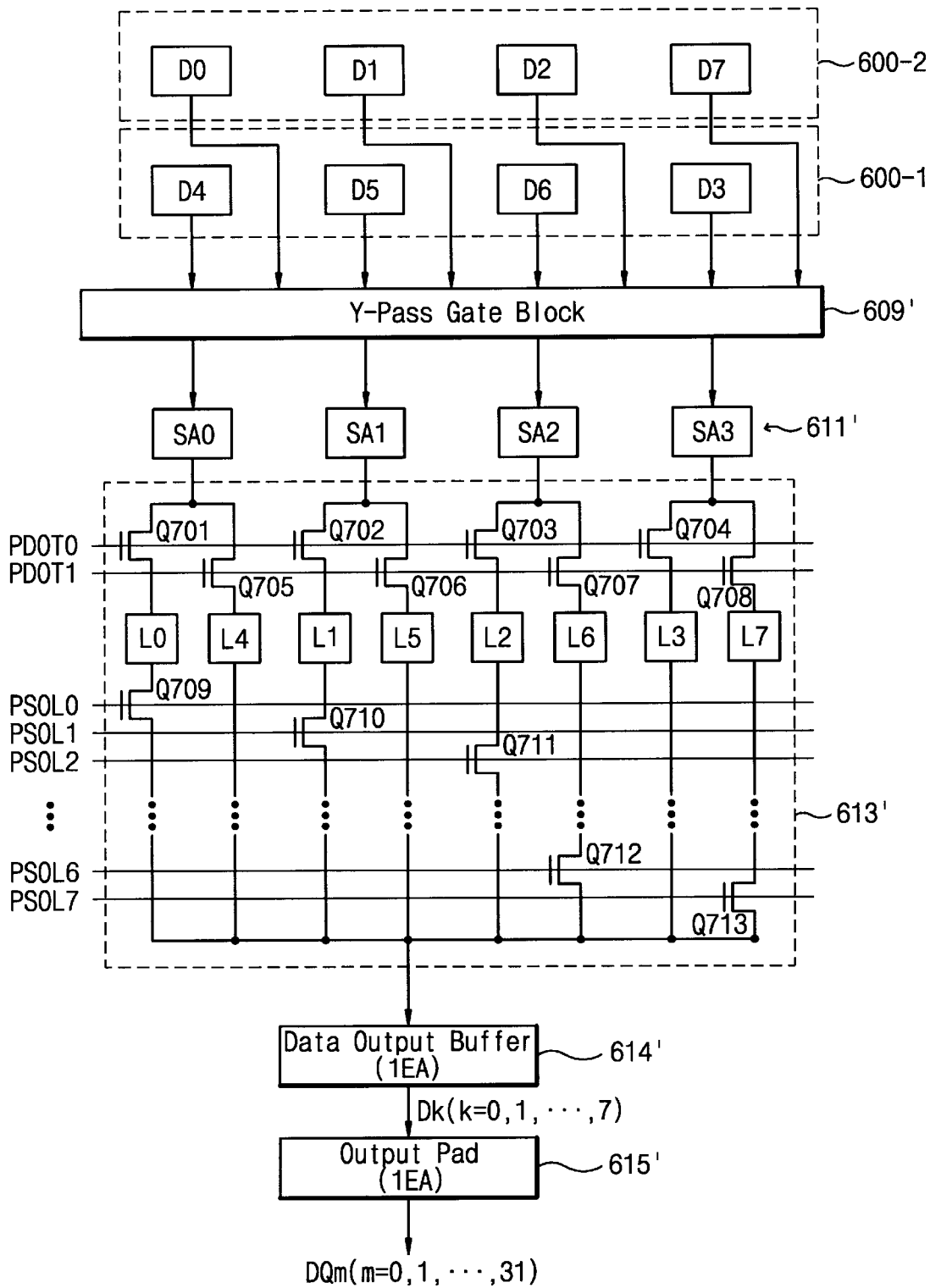
FIG. 7 is a schematic diagram of circuits involved in accessing data from a cell array to an output pad during a burst read-out mode in FIG. 6.

FIG. 7 shows a correlated configuration with circuit elements on a data output path assigned to one of data input/output pads 615 of FIG. 6. It should be noted that data input/output pad 615' (or data input/output pin DQm; m=0~31) corresponds to a cell block including 256 columns therein. Reference numerals 600-1 and 600-2 represent a couple of data sets retrieved each from the first and second sensing cycles. Thus, eight data bits, corresponding to the predetermined burst length 8, from eight memory cells are applied to block unit 611', included in the sense amplifier block 611 and having four sense amplifiers SA0~SA3, through Y-pass gate block 109' of the Y-pass gate 109, for two times of the sensing cycles. The sense amplifier block 611 of FIG. 6 has 32 block units like the 611'.

Block unit 613' of the data latch block 613 has eight latches L0~L7, input selection transistors Q701~Q708 for transferring four data bits provided from sense amplifier block unit 611' alternatively to two groups of latches, L0~L3 and L4~L7, in response to input selection signals PDOT0 and PDOT1 generated from burst address decoder 612, and output selection 102 . transistors Q709~Q713 for transferring, in response to output selection signals PSOL0~PSOL7 provided from burst address decoder 612, eight data bits held in latches L0~L7 to unit 614' of data output buffer 114, by one bit, in the order of Table 1.

Figure 8:
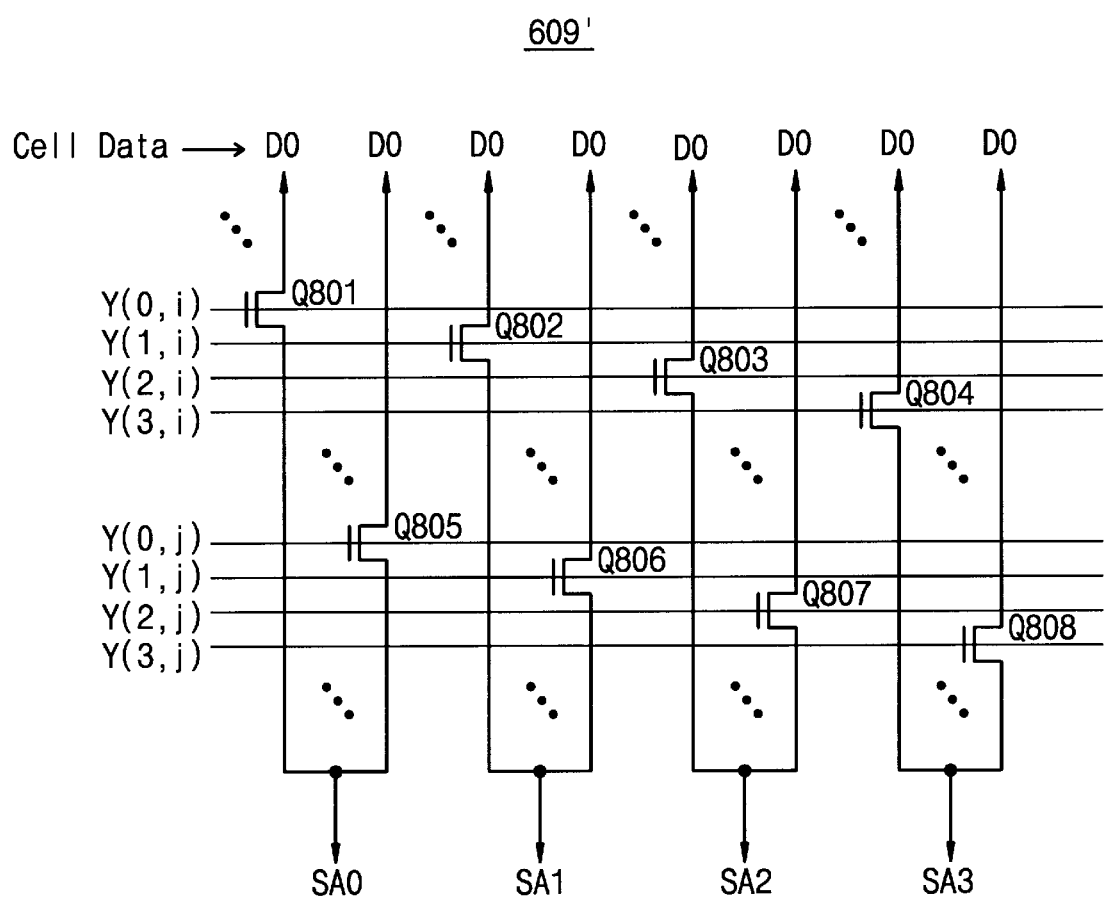
FIG. 8 is a schematic of an Y-pass gate block shown in FIG. 7.
Figure 9:
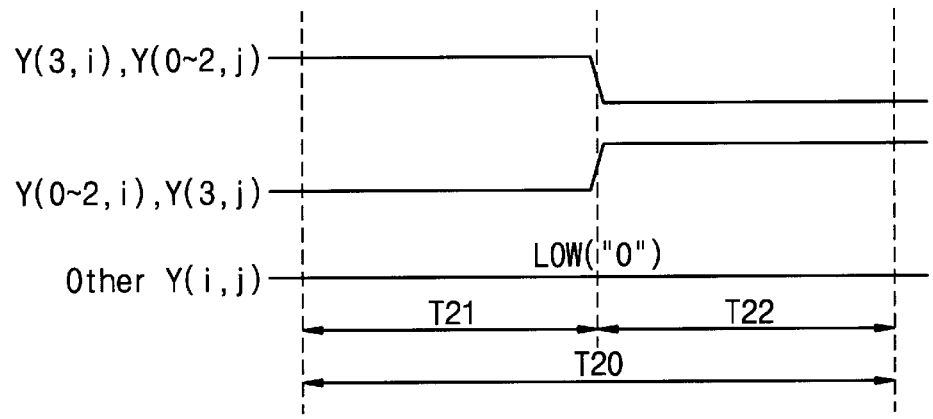
FIG. 9 is a timing diagram illustrating features of signals for controlling the Y-pass gate block in FIG. 8.

FIGS. 8 and 9 respectively show a configuration of the circuit and operational timing of Y-pass gate block 609', shown in FIG. 7. Pass transistors Q801~Q808 are connected between the data lines for D0~D7 and sense amplifiers SA0~SA3 to which an adjacent pair of the pass transistors is connected in common, gates of which are independently coupled to different gating control signals. Gates of pass transistors Q801~Q804 and Q805~Q808 are coupled to gating control signal Y[0,i]~Y[3,i] and Y[0,j]~Y[3,j], respectively. Referring to FIG. 9 of which the initial burst address is "011", during the first sensing period T21 for a first four data bits in entire sensing period T20 for BL=8, gating control signals Y[3,i] and Y[0~2,j] are enabled with high levels to transfer the data bits D3~D6 to the sense amplifiers SA0~SA3, while, during the second sensing period T22 for a second four data bits of the entire sensing period T20 for BL=8, the other data bits D7 and D0~D2 are applied to the sense amplifiers SA0~SA3 by high-leveled gating control signals Y[0~2,i] and Y[3,j]. During the sensing period T20 consisting of T21 and T22, other gating control signals Y[i,j] are held in disabled states of low levels.

Figure 10:
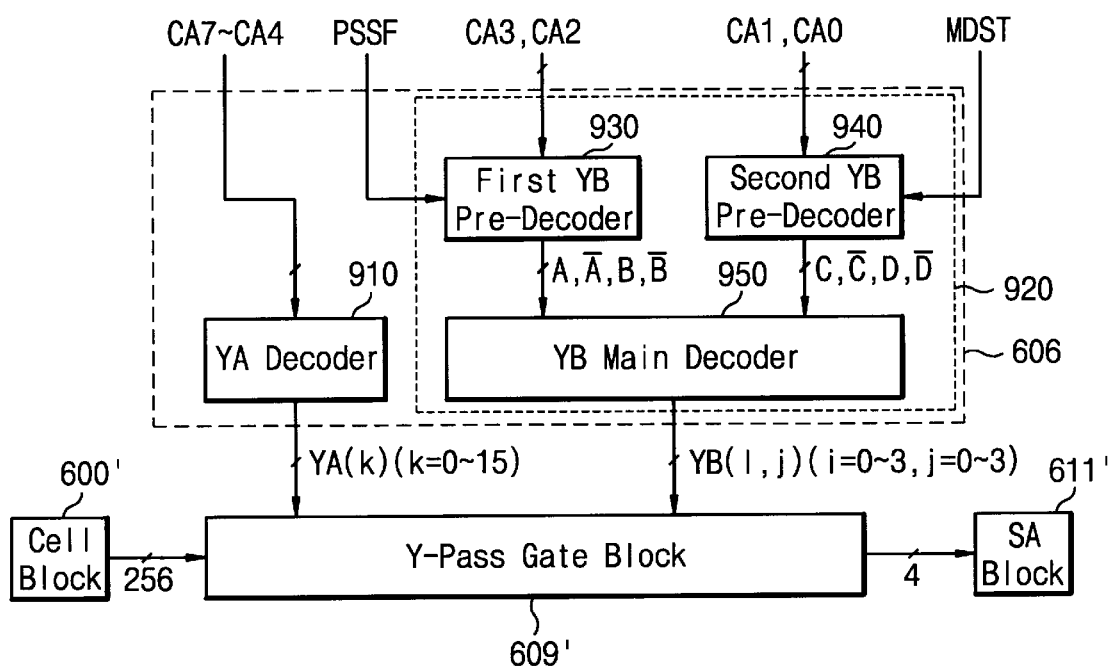
FIG. 10 is a circuit diagram of an Y-decoder shown in FIG. 6.

An internal construction of Y-decoder 606 is shown in FIG. 10, in which two kinds of decoders, YA- and YB-decoders, 910 and 920, are arranged. YA-decoder 910 receives and decodes the upper column address signals CA7~CA4, and then generates YA-gating control signals YA0~YA15 to be applied to Y-pass gate block 609'. YB-decoder 920 includes a first YB pre-decoder 930 for receiving column address signals CA3 and CA2 and for generating pre-decoding signals A/AB and B/BB in response to flag signal PSSF, a second YB pre-decoder 940 for receiving column address signals CA1 and CA2 (the lower bits of an initial burst address) and for generating pre-decoding signals C/CB and D/DB in response to mode setting signal MDST, and main YB decoder 950 for receiving the pre-decoding signals A/AB~D/DB (AB through DB are complementary signals of A through D, respectively) from the first and second YB pre-decoders and for generating YB-gating control signals YB[i,j](I and j are each 0~3) to be applied to Y-pass gate block 609'. The generation of the pre-decoding signals C/CB and D/DB is available when mode setting signal MDST is set for the sequential mode. MDST set for the interleave mode causes the second YB pre-decoder 940 use predetermined address signals in generating pre-decoding signals.

Figure 11:
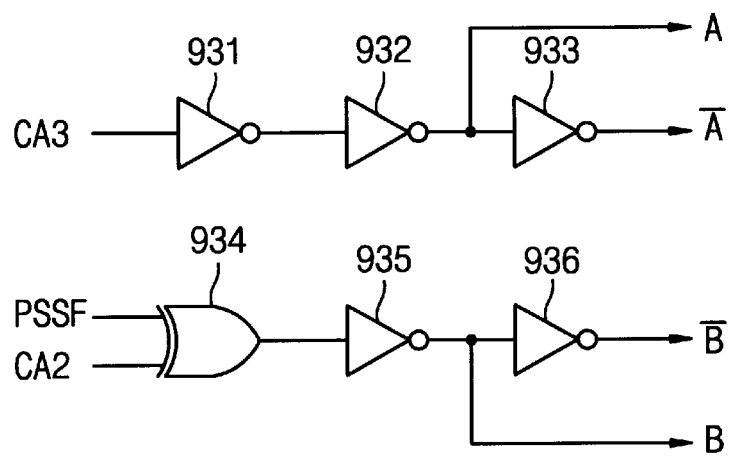
FIG. 11 is a circuit diagram of the first YB pre-decoder shown in FIG. 10.
Figure 12:
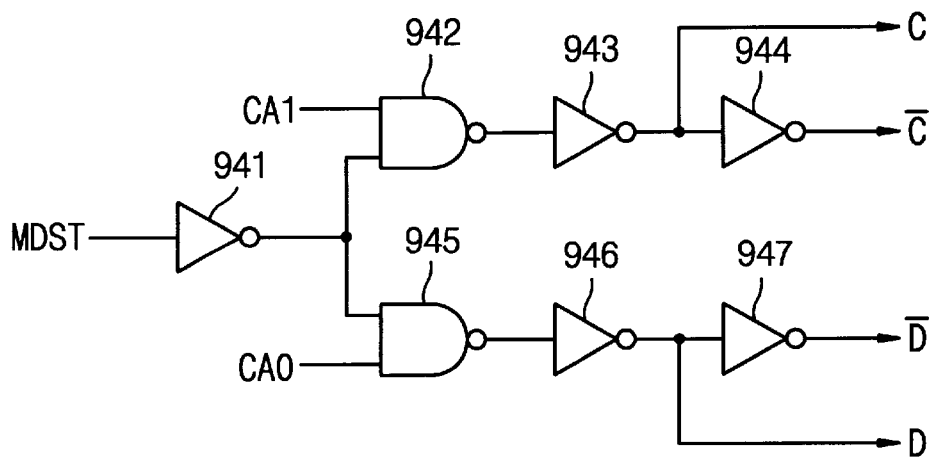
FIG. 12 is a circuit diagram of the second YB pre-decoder shown in FIG. 10.

FIGS. 11 and 12 shows internal circuits of the first and second YB pre-decoders, 930 and 940, respectively. Referring to FIG. 11, the first YB pre-decoder 930 has inverter 931 for receiving column address signal CA3, and exclusive-OR (XOR) gate 934 for receiving flag signal PSSF and column address signal CA2. Output of inverter 931 is rendered to YB pre-decoding signal AB through inverters 932 and 933 connected in serial thereof. Output of inverter 932 is YB pre-decoding signal A. Output of XOR gate 934 is rendered to YB pre-decoding signal BB through inverters 935 and 936 connected in serial thereof. Output of inverter 935 becomes YB pre-decoding signal B. The flag signal PSSF is disabled with low level for the first sensing cycle T21, while enabled with high level for the second sensing cycle T22. Referring to FIG. 12, the second YB pre-decoder 940 has inverter 931 for receiving mode setting signal MDST and two NAND gates 942 and 945, each receiving column address signals CA1 and CA0. Output of inverter 941 is applied to inputs of NAND gates 942 and 945 in common. Output of NAND gate 942 is rendered to YB pre-decoding signal CB through inverters 943 and 944 connected in serial thereof. Output of inverter 943 is YB pre-decoding signal C. Output of NAND gate 945 is rendered to YB pre-decoding signal DB through inverters 946 and 947 connected in serial thereof. Output of inverter 936 becomes YB pre-decoding signal D. The mode setting signal MDST is high in the interleave mode, while low in the sequential mode, which prevents the lower column address signals CA1 and CA0 from being transferred into the main YB-decoder 950 during the interleave mode.

Figure 13:
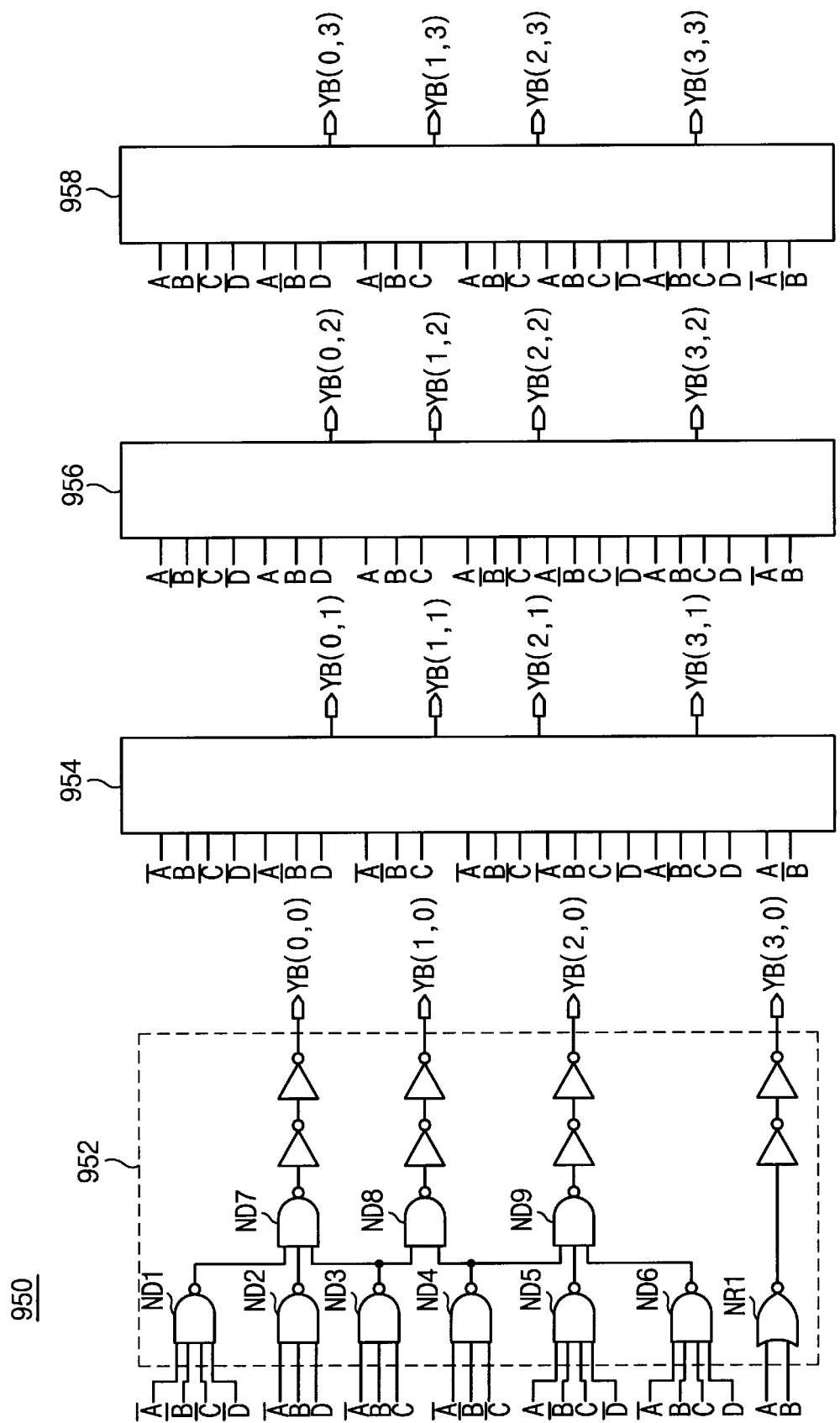
FIG. 13 is a circuit diagram of the main YB decoder shown in FIG. 10.

Referring to FIG. 13, main YB-decoder 950 is formed of four sections 952, 954, 956 and 958 which have the same construction as each other but have coded combinations with the YB pre-decoding signals applied to their inputs. For instance, section 952 has NAND gates ND1~ND6 receiving coded combinations with four pre-decoding signals, A/AB through D/DB, and NOR gate NR1 receiving coded combinations with two pre-decoding signals, A/AB and B/BB. Outputs of NAND gates ND1 through ND3 are applied to input of NAND gate ND7 whose output is rendered to be gating control signal YB[0,0] through two inverters connected in serial thereof. Outputs of NAND gates ND3 and ND4 are applied to input of NAND gate ND8 whose output is rendered to be gating control signal YB[1,0] through two inverters connected in serial thereof. Outputs of NAND gates ND4 through ND6 are applied to input of NAND gate ND9 whose output is rendered to be gating control signal YB[2,0] through two inverters connected in serial thereof. Outputs of NOR gates NR1 is rendered to be gating control signal YB[3,0] through two inverters connected in serial thereof. In the same manner, sections 954, 956 and 958 generate sets of gating control signals YB[0~3,1], YB[0~3, 2] and YB[0~3,3], respectively, in a matrix form.

Figure 14:
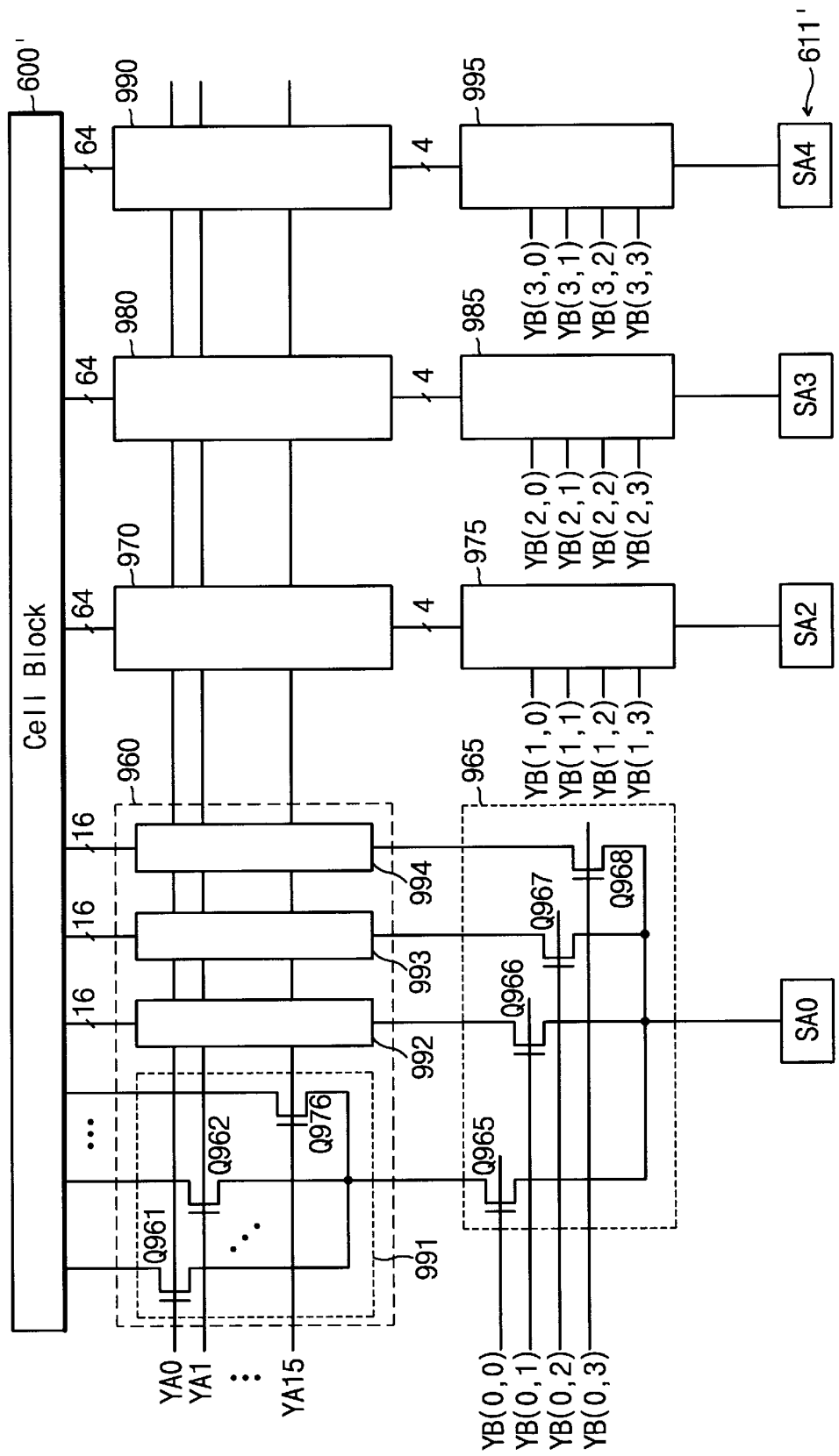
FIG. 14 is a circuit diagram of the Y-pass gate block shown in FIGS. 7 and 8.

FIG. 14 shows an internal configuration of Y-pass gate block 609' in more normal dimension, corresponding to the four sense amplifiers SA0 through SA3, as same as FIG. 8. For one sense amplifier, the Y-pass gate block 609' is divided into two sections, i.e., YA gating section 960 (970, 980 or 990) controlled by YA0~YA 15 generated from YA decoder 910 and YB gating section 965 (975, 985 or 995) controlled by YB[i,j](I=0~3 and j=0~3) generated from YB decoder 920. Each of the YA gating sections is divided into gating segments 991~994 with the same number of pass transistors Q965~Q968 belonging to each of the YB gating sections corresponding thereto. Namely, as in FIG. 8, all the pass transistors Q961~Q976 of segment 991 in YA gating section 960 are commonly connected to one of pass transistors in YB gating section 965. Thus, for instance, an alternative one out of the pass transistors Q961~Q976 of YA gating section 960 can be connected to sense amplifier SA0 through pass transistor Q965 of YB gating section 965, responding to the gating control signals YA0~YA15 and YB[i,j](I=0~3 and j=0~3). The YB gating sections are controlled by different sets of the YB-gating signals which are supplied from the Y-decoder 606, while the YA gating sections are coupled to the YA-gating signals in common. YB gating section 965 transfers one out of data bits supplied from YA gating section 960 to sense amplifier SA0 by control of YB[0,0~3]. YB gating section 975 transfers one out of data bits supplied from YA gating section 970 to sense amplifier SA1 by control of YB[1,0~3]. YB gating section 985 transfers one out of data bits supplied from YA gating section 980 to sense amplifier SA2 by control of YB[2,0~3]. YB gating section 995 transfers one out of data bits supplied from YA gating section 990 to sense amplifier SA3 by control of YB[3,0~3]. Data bits from the sense amplifiers are transferred to data latch block 613.

It can be seen that, with respect to the features of accessing data bits, since one YA gating section (e.g., 960) has 4 gating segments (e.g., 991~994) each of which is assigned to 16 data bits, the 4 YA gating sections (e.g., 960, 970, 980 and 990) are capable of accessing 256 bits of data, and 4 data bits are selected by YB gating sections (e.g., 965, 975, 985 and 995) to be transferred to 4 sense amplifiers (e.g., SA0 SA3) in one times of sensing cycle. Therefore, it can be understood that, assuming that the number of the sense amplifiers is 128 so as to complete the read-out operation in two sensing cycles, the units including cell block 600', the four YA and YB gating blocks, and the four sense amplifiers, shown in FIG. 14, are arranged with the number of 64 in the memory device of the invention. Outputs from the sense amplifiers are applied to data latches of data latch block 613, as shown in FIG. 6. The number of the data latches in block 613 is 256 for receiving 256 data bits which correspond to the amount of data bits accessed by the 128 sense amplifiers in two times of sensing cycle.

Figure 15:
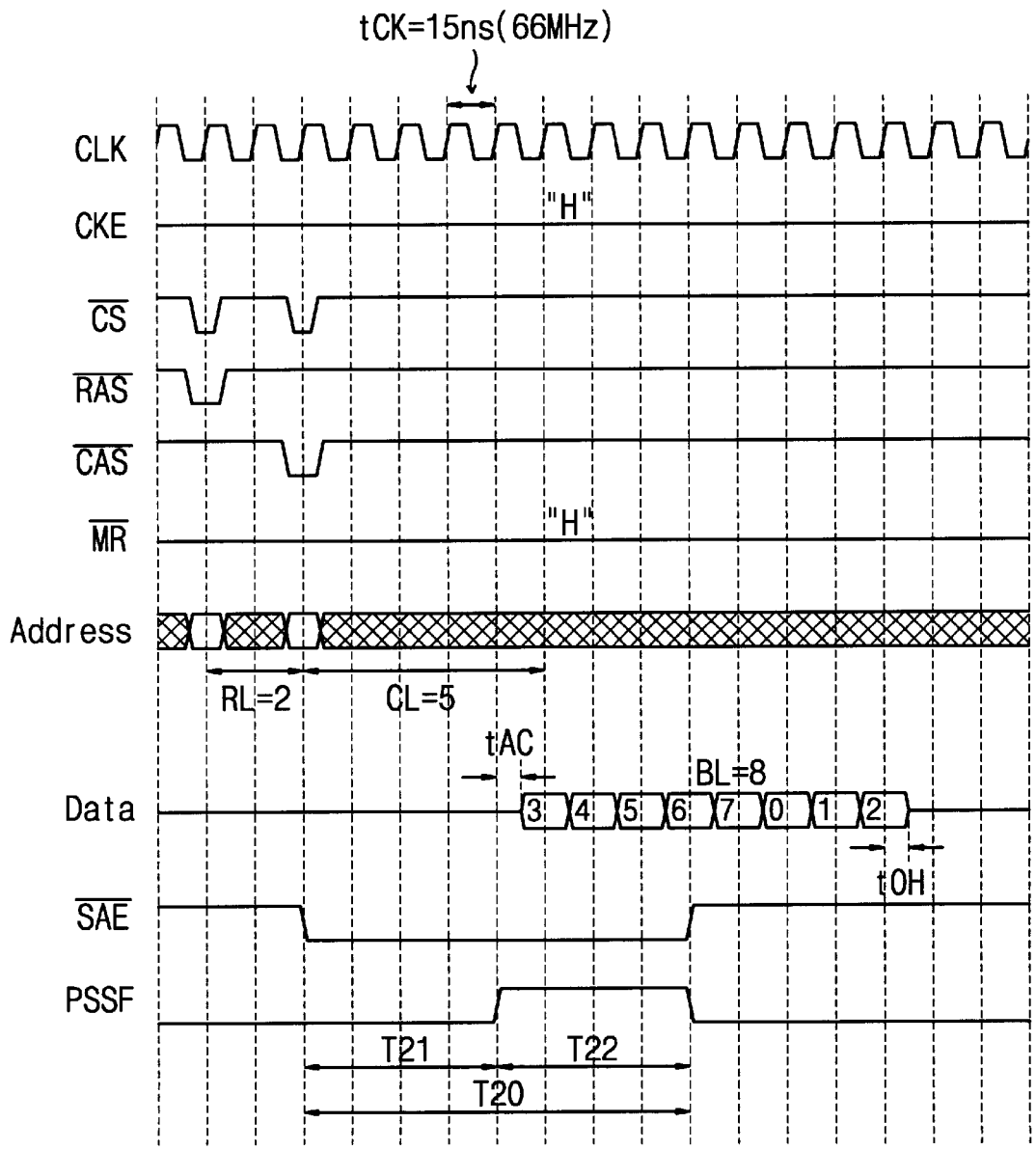
FIG. 15 is a timing diagram illustrating a read-out operation during the burst read-out mode in the memory of FIG. 6.

FIG. 15 shows a preferred timing operation of a burst read-out sequence in this embodiment. In FIG. 15, it is assumed that the cycle time of clock CLK, tCLK, is 15 ns (this corresponds to 66 MHz), RAS latency RL is 2, CAS latency is 5, the burst length is 8 and the initial burst address is "011". Those embodied conditions mean that output data is sequentially generated through eight times, after five clock cycles from an activation of the column address strobe signal CASB. And the burst length of 8 needs three bits of burst address such as BA0, BA1 and BA2. Referring to FIG. 15, clock enable signal CKE is held at high level while CLK is being oscillated. As row address strobe signal RASB and chip selection signal CSB are enabled to drop to low level responding to the second rising of CLK, row address signals RA0~RA11 are latched in address buffer 601. And, sequentially, column address signals CA0~CA7 are latched in address buffer 601 when column address strobe signal CASB and chip selection signal CSB drop to low level at the fourth rising of CLK. After five cycle times of CLK from the activation of CASB, output data bits of one page appear at the data lines. Since the initial burst address is assumed to be"011", the order of data bits generated is 3-4-5-6-7-0-1-2 (i.e., D3-D4-D5-D6-D7-D0-D1-D2) in the sequential mode or 3-2-1-0-7-6-5-4 (i.e., D3-D2-D1-D0-D7-D6-D5-D4) in the interleave mode. In the sequential mode, the first four data bits, D3-D4-D5-D6, are accessed in the first sensing operation, and the next four data bits, D7-D0-D1-D2, are accessed in the second sensing operation. Otherwise, if in the interleave mode, the first four data bits, D3-D2-D1-D0, are accessed in the first sensing operation, and the next four data bits, D7-D6-D5-D4, are accessed in the second sensing operation.

In the timing diagram of FIG. 15, sense amplifier enable signal SAEB is enabled to low level during sensing period T20, that is composed of the first and second periods T21 and T22 and is possible to be practiced either to the sequential mode or the interleave mode. Such settlement of the sensing period is possible from decoding the Y-gating with the circuit constructions as shown in FIGS. 8 and 14. Namely, referring again to FIGS. 8 and 9 as an example, in the sequential mode, accessing the D3-D4-D5-D6 is permitted under activations of gating control signals Y[3,i], Y[0,j], Y[1,j] and Y[2,j], and accessing the D7-D0-D1-D2 is accomplished under activations of gating control signals Y[3,j], Y[0,i], Y[1,i] and Y[2,i].

Since the data bits of the burst length (BL=8) are pipelined in serial without staggering the order of the sensing operations between subsequent data bits until one of the sensing operations is completed, the sequential mode, as well as the interleave mode, can have the sensing period T20 which provides an extension of the time for sensing in the burst read-out operation, not limited in accordance with a burst length less than five. As the clock cycle time is 15 ns, the time of the sensing period T20 for eight data bits of BL=8 may be about 120 ns. It should be recognized that the real time of the sensing period for a given burst length could be determined by a clock cycle time.

The arrangements of selecting and decoding the Y-gating control signals, shown in FIGS. 8 through 15, provides flexibility of a sensing period for reading and a security of a read-out performance to the memory having a given burst length.

Although specific constructions and procedures of the invention have been illustrated and described herein, it is not intended that the invention be limited to the elements and constructions disclosed. One skilled in the art will easily recognize that the particular elements or subconstruction may be used without departing from the scope and spirit of the invention.

What is claimed is:

1. A read only memory device having a given burst length, comprises:

a memory cell array having a plurality of memory cells, each of the memory cells storing a data bit;

a pass gate circuit having a plurality of pass gate blocks assigned to a plurality of bit lines coupled to the memory cells;

a sense amplifier circuit having a plurality of sense amplifiers connected to the pass gate blocks with a given ratio thereof;

decoding means for causing the pass gate circuit to transfer a given number of the data bits from the memory cells to the sense amplifier circuit; and means for receiving the data bits from the sense amplifier circuit and for outputting a plurality of data bits corresponding to the burst length in a given operation mode.

2. The device of claim 1, wherein the operation mode is one of a sequential mode and an interleaved mode.

3. A read only memory device having a given burst length, comprises:

a memory cell array having a plurality of memory cells, each of the memory cells storing a data bit;

means for setting an operation mode which determines an order of outputting the data bits according to the burst length;

a pass gate circuit having a plurality of pass gate blocks assigned to a plurality of bit lines coupled to the memory cells;

a sense amplifier circuit having a plurality of sense amplifiers connected to the pass gate blocks with a given ratio thereof;

decoding means for causing the pass gate circuit to transfer a given number of the data bits from the memory cells to the sense amplifier circuit, responding to a signal generated from the setting means; and means for receiving the data bits from the sense amplifier circuit and for outputting a plurality of data bits corresponding to the burst length in a given operation mode.

4. The device of claim 3, wherein the operation mode is one of a sequential mode and an interleaved mode.

5. A read only memory device having a given burst length, comprises:

a memory cell array having a plurality of memory cells, each of the memory cells storing a data bit;

means for setting an operation mode which determines an order of outputting the data bits according to the burst length;

a pass gate circuit having a plurality of pass gate blocks assigned to a plurality of bit lines coupled to the memory cells;

a sense amplifier circuit having a plurality of sense amplifiers connected to the pass gate blocks with a given ratio thereof, the sense amplifier being conducted in a given times of sensing the data bits;

decoding means for causing the pass gate circuit to transfer a given number of the data bits from the memory cells to the sense amplifier circuit, the decoding means receiving a signal informing of the number of sensing operations by the sense amplifier circuit and a signal informing of the operation mode, the signals being supplied from the setting means; and means for receiving the data bits from the sense amplifier circuit and for outputting a plurality of data bits corresponding to the burst length in a given operation mode.

6. The device of claim 5, wherein the operation mode is one of a sequential mode and an interleaved mode.

* * * * *